(12) United States Patent
Corcoran et al.

(10) Patent No.: US 7,514,045 B2
(45) Date of Patent: Apr. 7, 2009

(54) COVERED MICROCHAMBER STRUCTURES

(75) Inventors: Craig S. Corcoran, Rockford, IL (US);
Cindy Chia-Wen Chiu, San Dimas, CA (US); William J. Jaecklein, Mentor, OH (US); Dong-Tsai Hseih, Arcadia, CA (US); Eng-Pi Chang, Arcadia, CA (US); Le-Hoa Hong, Monterey Park, CA (US); Zhisong Huang, San Dimas, CA (US); Michael Lang, Chagrin Falls, OH (US); Ronald Sieloff, Chardon, OH (US); Philip Yi Zhi Chu, Monrovia, CA (US)

(73) Assignee: Avery Dennison Corporation, Pasadena, CA (US)

( * ) Notice: Subject to any disclaimer, the term of this patent is extended or adjusted under 35 U.S.C. 154(b) by 1165 days.

(21) Appl. No.: 10/346,279

(22) Filed: Jan. 17, 2003

(65) Prior Publication Data
US 2003/0180190 A1   Sep. 25, 2003

Related U.S. Application Data

(60) Provisional application No. 60/349,909, filed on Jan. 18, 2002, now abandoned.

(51) Int. Cl.
*B01L 11/00* (2006.01)
*B32B 3/00* (2006.01)

(52) U.S. Cl. .................. 422/100; 422/102; 264/284
(58) Field of Classification Search ............. 422/99, 422/100, 102, 942; 264/284
See application file for complete search history.

(56) References Cited

U.S. PATENT DOCUMENTS

| | | | |
|---|---|---|---|
| 3,432,275 A | 3/1969 | Unger | 23/292 |
| 3,713,921 A | 1/1973 | Fleischer et al. | 156/2 |
| 3,855,741 A * | 12/1974 | Semon | 52/19 |
| 4,125,310 A * | 11/1978 | Reardon et al. | 439/329 |
| 4,280,909 A | 7/1981 | Deutsch | |
| 4,478,769 A | 10/1984 | Pricone et al. | 264/1.6 |
| 4,486,363 A | 12/1984 | Pricone et al. | 264/1.4 |
| 4,550,846 A * | 11/1985 | Phillips | 215/296 |
| 4,599,315 A | 7/1986 | Terasaki et al. | 435/301 |
| 4,601,861 A | 7/1986 | Pricone et al. | 264/1.6 |

(Continued)

FOREIGN PATENT DOCUMENTS

GB   2 330 331 A   4/1999

(Continued)

OTHER PUBLICATIONS

U.S. Appl. No. 10/346,242, filed Jan. 17, 2003, Corcoran et al.

(Continued)

*Primary Examiner*—Jill Warden
*Assistant Examiner*—Paul S Hyun

(57) ABSTRACT

A microchamber structure (100) comprising a base layer (120), a lid layer (130), and at least one microchamber (140) having a cross-sectional shape with a depth (d) of less than 1000 microns and a width (w) of less than 1000 microns. The base layer (120) includes a depression (122) and the lid layer (104) includes a projection (132) positioned within the depression (122) to together define the cross-sectional shape of the microchamber (140).

27 Claims, 12 Drawing Sheets

U.S. PATENT DOCUMENTS

| | | | | |
|---|---|---|---|---|
| 4,964,992 | A | | 10/1990 | Goldsmith et al. ..... 210/500.36 |
| 5,035,866 | A | * | 7/1991 | Wannlund .................... 422/102 |
| 5,049,085 | A | | 9/1991 | Reylek et al. ................. 439/91 |
| 5,059,262 | A | | 10/1991 | Calhoun et al. ............... 156/47 |
| 5,174,766 | A | | 12/1992 | Yoshizawa et al. ............ 439/91 |
| 5,188,702 | A | | 2/1993 | Takayama et al. ........... 156/630 |
| 5,213,872 | A | | 5/1993 | Pricone et al. .............. 428/195 |
| 5,275,856 | A | | 1/1994 | Calhoun et al. ............... 428/40 |
| 5,330,684 | A | | 7/1994 | Emori et al. ................. 252/512 |
| 5,362,421 | A | | 11/1994 | Kropp et al. ................. 252/512 |
| 5,401,913 | A | | 3/1995 | Gerber et al. ............... 174/264 |
| 5,438,223 | A | | 8/1995 | Higashi et al. .............. 257/774 |
| 5,443,890 | A | | 8/1995 | Ohman ........................ 428/167 |
| 5,486,427 | A | | 1/1996 | Koskenmaki et al. ....... 428/546 |
| 5,531,942 | A | | 7/1996 | Gilleo et al. ..................... 264/5 |
| 5,571,410 | A | * | 11/1996 | Swedberg et al. ........ 210/198.2 |
| 5,601,678 | A | | 2/1997 | Gerber et al. ............... 156/150 |
| 5,637,176 | A | | 6/1997 | Gilleo et al. ................. 156/277 |
| 5,685,939 | A | | 11/1997 | Wolk et al. .................. 156/234 |
| 5,686,703 | A | | 11/1997 | Yamaguchi ................. 174/259 |
| 5,698,496 | A | | 12/1997 | Fastnacht et al. ............ 505/470 |
| 5,741,463 | A | | 4/1998 | Sanadi ........................ 422/101 |
| 5,769,996 | A | | 6/1998 | McArdle et al. ......... 156/272.4 |
| 5,805,425 | A | | 9/1998 | Peterson ..................... 361/769 |
| 5,813,870 | A | | 9/1998 | Gaynes et al. ................. 439/91 |
| 5,873,161 | A | | 2/1999 | Chen et al. .................... 29/830 |
| 5,890,915 | A | | 4/1999 | Reylek ......................... 439/91 |
| 5,891,366 | A | | 4/1999 | Gruenwald et al. ......... 252/514 |
| 5,902,438 | A | | 5/1999 | Arthur et al. ................ 156/247 |
| 5,910,641 | A | | 6/1999 | Gaynes et al. ............. 174/52.4 |
| 5,932,315 | A | * | 8/1999 | Lum et al. ................... 428/172 |
| 6,015,214 | A | | 1/2000 | Heenan et al. .............. 359/529 |
| 6,042,894 | A | | 3/2000 | Goto et al. ................... 427/504 |
| 6,063,476 | A | | 5/2000 | Kinoshita .................... 428/131 |
| 6,149,857 | A | | 11/2000 | McArdle et al. ............ 264/429 |
| 6,180,226 | B1 | | 1/2001 | McArdle et al. ............ 428/332 |
| 6,197,397 | B1 | | 3/2001 | Sher et al. .................... 428/42.3 |
| 6,210,986 | B1 | * | 4/2001 | Arnold et al. ................. 438/42 |
| 6,211,468 | B1 | | 4/2001 | Windschitl .................. 174/254 |
| 6,214,460 | B1 | | 4/2001 | Bluem et al. ................. 428/355 |
| 6,261,523 | B1 | | 7/2001 | Schembri ..................... 422/102 |
| 6,328,342 | B1 | | 12/2001 | Belousov et al. |
| 2002/0100714 | A1 | * | 8/2002 | Staats .......................... 210/85 |
| 2004/0022691 | A1 | * | 2/2004 | Allen et al. .................. 422/102 |

FOREIGN PATENT DOCUMENTS

| | | |
|---|---|---|
| JP | 63266708 | 11/1988 |
| JP | 8273441 | 10/1996 |
| JP | 10064341 | 3/1998 |
| JP | 2000149666 | 5/2000 |
| WO | WO 00/00563 | 1/2000 |
| WO | WO 00/38823 | 7/2000 |
| WO | WO 01/60589 | 8/2001 |
| WO | 02/02736 A1 | 1/2002 |
| WO | 02/072423 A1 | 9/2002 |
| WO | 03/008931 | 1/2003 |

OTHER PUBLICATIONS

U.S. Appl. No. 10/346,288, filed Jan. 17, 2003, Chiu et al.
International Search Report (PCT/ISA/210) from corresponding International Application No. PCT/US03/01527 mailed May 27, 2003.
Kameoka, J. et al; "A Polymeric Microfluidic Device for Separation of Small Molecule" Microfluidics and Biomems, San Francisco, CA, USA, Oct. 22-24, 2001, pp. 227-235.

* cited by examiner

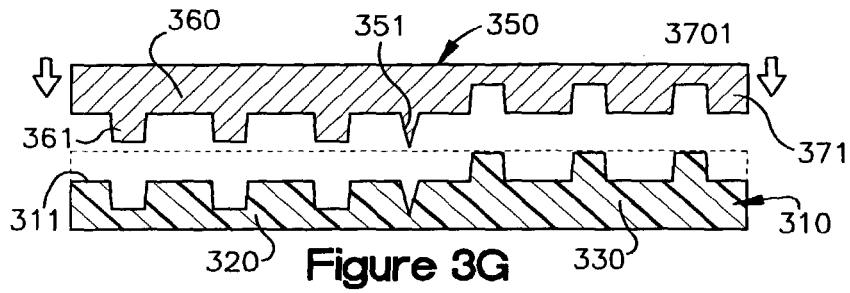
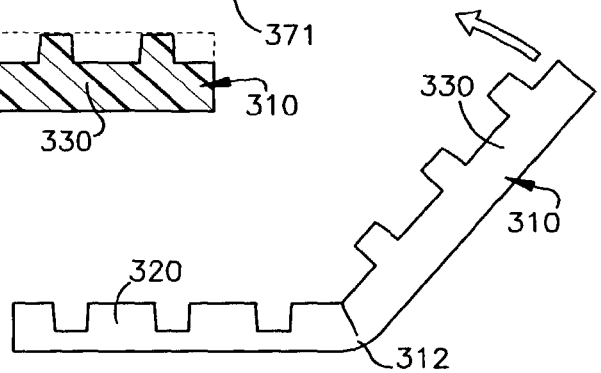
Figure 3G
Figure 3H
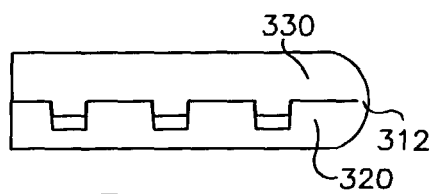
Figure 3I
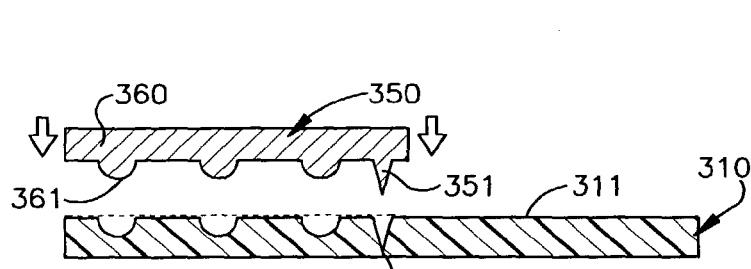
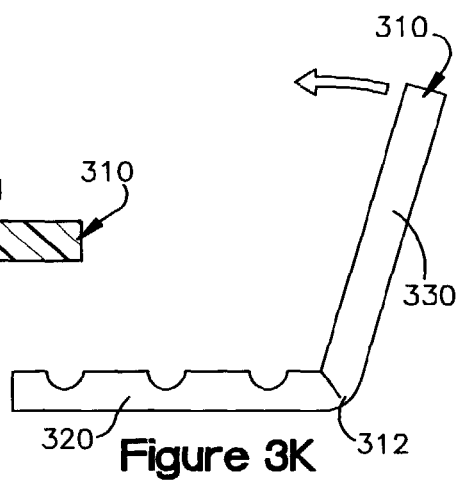
Figure 3J
Figure 3K
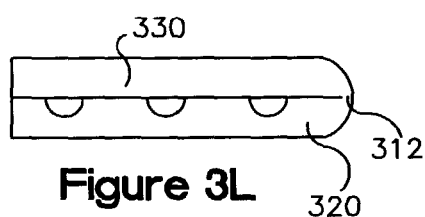
Figure 3L

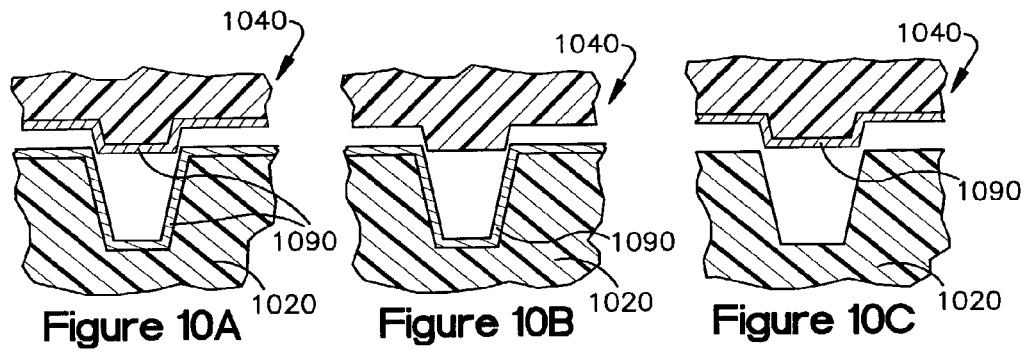
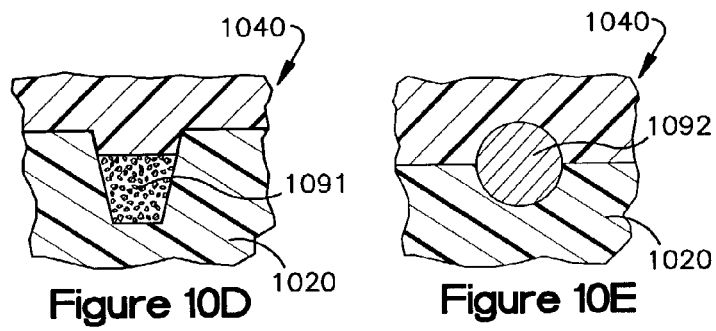
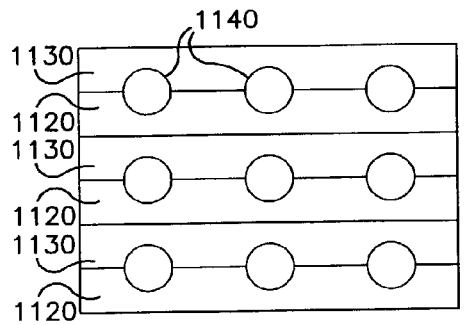
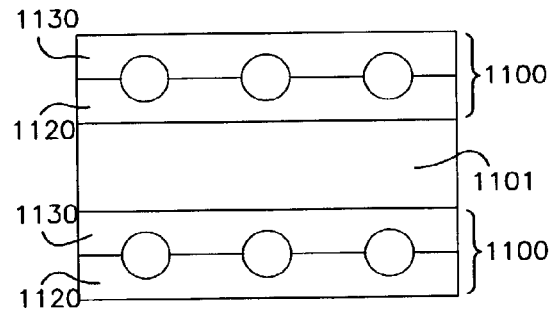
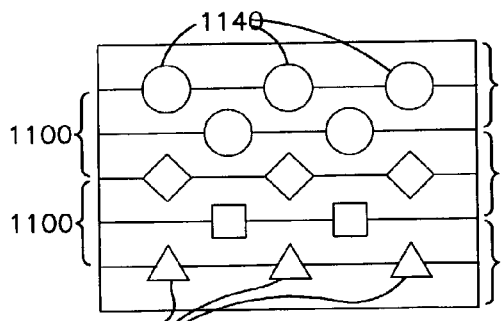
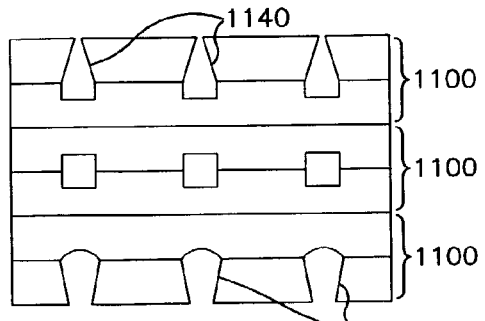

COVERED MICROCHAMBER STRUCTURES

RELATED APPLICATIONS

This application claims priority under 35 U.S.C. §119(e) to U.S. Provisional Patent Application No. 60/349,909 filed on Jan. 18, 2002. The entire disclosure of this provisional application is hereby incorporated by reference.

FIELD OF THE INVENTION

This invention relates to covered microchamber structures which are suitable for incorporation into microfluidic, microelectronic, micromechanical, and/or microoptical devices requiring covered chambers and/or registration devices.

BACKGROUND OF THE INVENTION

Microchamber structure refers to a structure having one or more microsized chambers (e.g., a cross-sectional dimension no greater than 1000 microns) arranged in a predetermined pattern on a substrate that can be, for example, a rigid or flexible sheet. The microchambers form channels, wells, passageways, recesses, and/or other enclosed spaces which may or may not be interconnected. In many instances, the top of these chambers can and/or should be uncovered. However, covered microchambers are often required for certain microfluidic, microelectronic, micromechanical, microoptical, and/or other microsized applications. Also, when a top layer and a bottom layer are joined to make microchambers (or for any other reason for that matter), registration between the layers may be necessary.

SUMMARY OF THE INVENTION

The present invention provides a microchamber structure with at least one microchamber having a cross-sectional shape with a depth (d) and a width (w) of less than 1000 microns, less than 500 microns, and/or less than 250 microns. Accordingly, the structure can be incorporated into microfluidic, microelectronic, micromechanical, and/or microoptical devices requiring covered microchambers. In any event, the cover constructions of the present invention are believed to have advantages neither appreciated nor provided by prior art covered microchamber constructions. Additionally or alternatively, the microchamber structure can be used solely or additionally for registration purposes.

More particularly, the present invention provides a microchamber structure including a base layer, a lid layer, and at least one microchamber. The base layer can have a depression extending inwardly from its lid-adjacent surface and the lid layer can have a lid portion aligned with the depression so that the depression and the lid portion define the cross-sectional shape of the microchamber. The lid portion can be a projection positioned within the depression in the base layer and/or a depression aligned with the base layer's depression. The lid layer can additionally or alternatively be made of compliant material. The base layer and the lid layer can comprise separate sheets or can comprise a single sheet folded to form the two layers. Additionally or alternatively, the base layer and/or the lid layer can include walls forming a recess in which adhesive is positioned to attach the layers together. Instead of using adhesive, the cover layer can comprise a dry photoimageable polymer film laminated to the base layer.

The microchamber structure can be made by embossing the base layer with a tool having embossing elements corresponding to the depression and, if relevant, the adhesive-containing recesses. If the lid layer includes a projection, a depression, and/or adhesive-containing recesses, it can be embossed with a tool having embossing elements corresponding thereto. If the base layer and the lid layer are formed from separate sheets, the embossed layers can be aligned and then mated to form the microchamber(s). If the base layer and the lid layer are formed from a single sheet, the embossed sheet can be folded to form the microchamber(s).

The present invention also provides a microchamber structure including a sheet having a coextensive surface and at least one depression extending inwardly from this surface. The depression is defined by opposed sidewalls having lid regions which contact each other to form a lid for the covered microchamber(s). This structure can be made by providing a sheet with depressions, wherein the lid regions are positioned remotely to each other (e.g., each depression has an open top), and curling the sheet so that the lid regions contact each other to form the covered microchamber(s).

The microchamber structures of the present invention can comprise a plurality of microchambers arranged in parallel longitudinal rows, parallel columns, in a grid of rows and columns, in a map-like arrangement of straight roads, in a combination of circular and straight patterns, and/or in irregular river-like shapes. These paths of the microchambers can travel independently of each other and/or can intersect one or more times with each other. The chamber(s) can be empty (e.g., void except for air) or they can contain, for example, coating, particles and/or strands having reflective, filtering, electrically conductive and/or thermally conductive properties. The microchamber structures of the present invention can be positioned in a single level or can be assembled in a stack.

These and other features of the invention are fully described and particularly pointed out in the claims. The following description and drawings set forth in detail certain illustrative embodiments of the invention which are indicative of but a few of the various ways in which the principles of the invention may be employed.

DRAWINGS

FIGS. 3D-3L are schematic views of a method of making the microchamber structure 300.

FIG. 5 is a perspective, partially cut-away, view of a microchamber structure 500 according to the present invention, the structure including at least one microchamber 540.

FIGS. 10A-10E are close-up cross-sectional views of a microchamber 1040 having interior enhancements according to different embodiments of the invention.

FIGS. 11A-11D are schematic side views of a plurality of stacked microchamber structures 1100 according to different embodiments of the invention.

DETAILED DESCRIPTION

Figure 1:
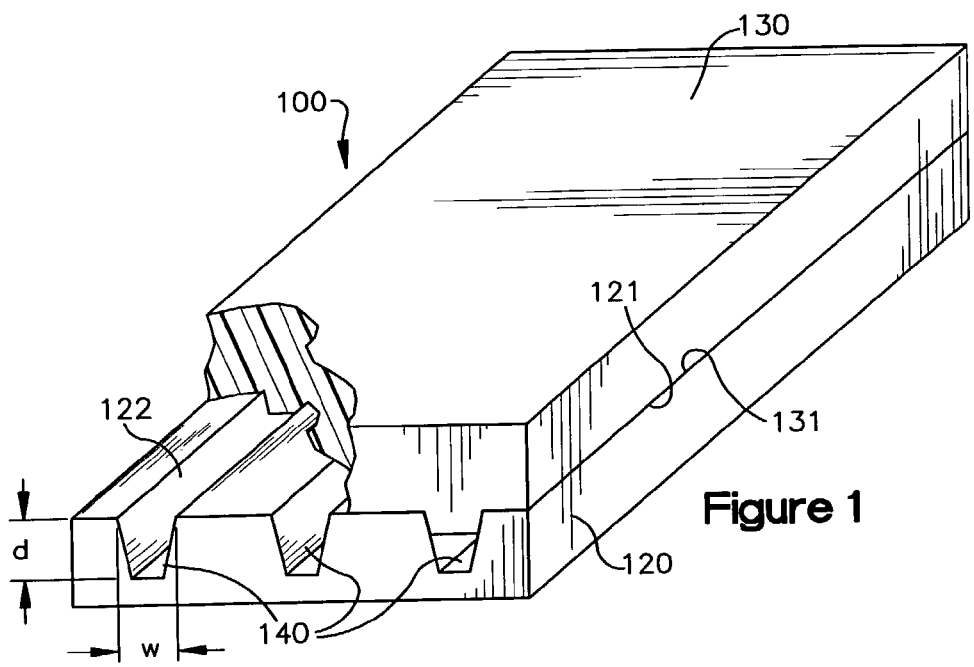
FIG. 1 is a perspective, partially cut-away, view of a microchamber structure 100 according to the present invention, the structure including at least one microchamber 140.

Referring now to the drawings in detail, and initially to FIG. 1, a microchamber structure 100 according to the present invention is shown. The structure 100 includes a base layer 120, a lid layer 130, and at least one covered microchamber 140. The microchamber 140 has a cross-sectional shape with a depth (d) of less than 1000 microns and a width (w) of less than 1000 microns, a depth (d) of less than 500 microns and a width (w) of less than 500 microns, and/or a depth (d) of less than 250 microns and a width (w) of less than 250 microns. Accordingly, the structure 100 can be incorporated into microfluidic, microelectronic, micromechanical, and/or microoptical devices requiring covered microchambers.

Figure 1A:
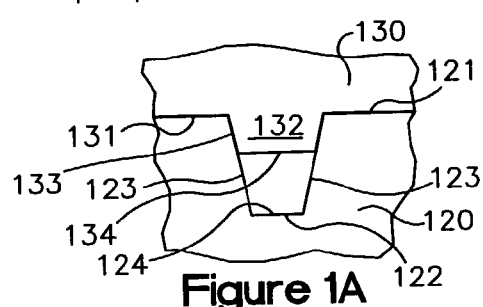
FIGS. 1A-1L are close-up cross-sectional views of the microchamber 140 according to different embodiments of the invention.

As is best seen in FIG. 1A, the base layer 120 and the cover layer 130 are superimposed, whereby one surface 121 of the base layer 120 is positioned adjacent to one surface 131 of the lid layer 130. The base layer 120 includes a depression 122 extending inwardly from its lid-adjacent surface 121, and the lid layer 130 includes a projection 132 positioned within the depression 122. The depression 122 of the base layer 120 and the projection 132 of the lid layer 130 define the cross-sectional shape of the microchamber 140.

In the illustrated embodiment the chambers 140 extend to the structure's lateral edges, and cover layer 130 appears sealed to the exterior environment. However, a microchamber structure 100 without these particular features is certainly possible with and contemplated by the present invention. For example, the chambers 140 could begin/terminate well inside the structure's perimeter (see FIG. 9H) and/or the cover layer 130 (or the base layer 120) could have openings for input/output access unique to the particular application.

In the embodiment shown in FIG. 1A, the depression 122 is defined by tapering sidewalls 123 and a flat bottom wall 124. The projection 132 is defined by tapering sidewalls 133 and a flat bottom wall 134, which are sized and shaped for an interference-fit into the upper region of the depression 122. In this manner, the projection 132 closes off the depression 122 in a cork-like manner. The space between the bottom wall 124 of the depression 122 and the bottom wall 134 of the projection 132 define the cross-sectional shape of the microchamber 140.

Figure 1B:
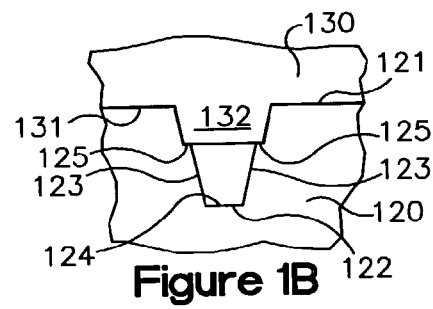

In the embodiment shown in FIG. 1B, the depression 122 is defined by sidewalls 123 and a flat bottom wall 124, with the sidewalls 123 forming a top region, a narrower bottom region, and a shelf 125 therebetween. The projection 132 is defined by tapering sidewalls 133 sized for receipt into the top region of the depression 122 and a flat end wall 134 sized to rest on the shelf 125. Accordingly, the shelf 125 functions as a mechanical stop for the projection 132.

Figure 1C:
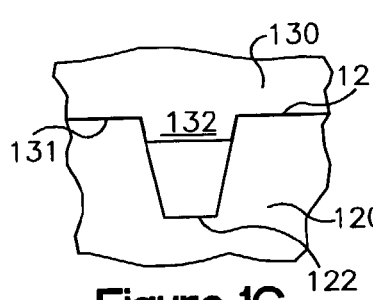
Figure 1D:
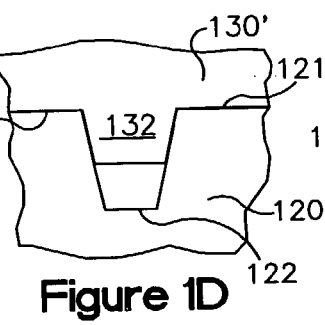
Figure 1E:
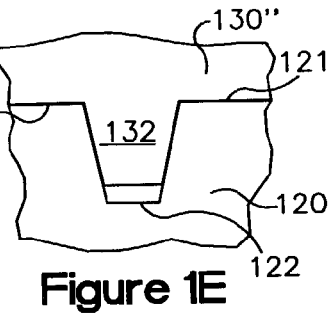
Figure 1F:
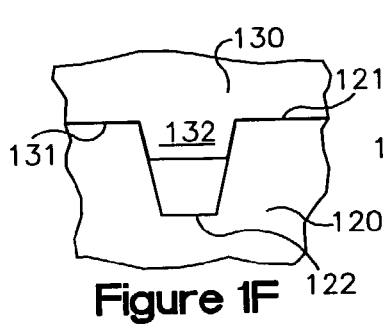
Figure 1G:
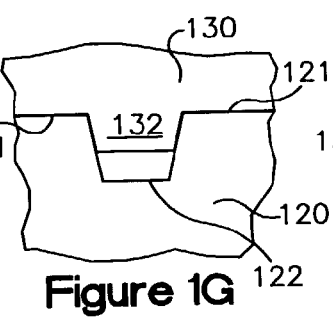
Figure 1H:
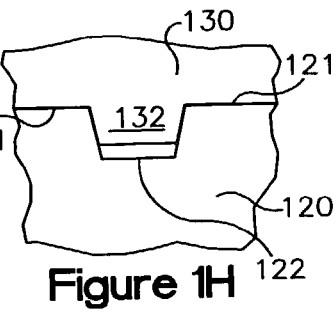
Figure 1I:
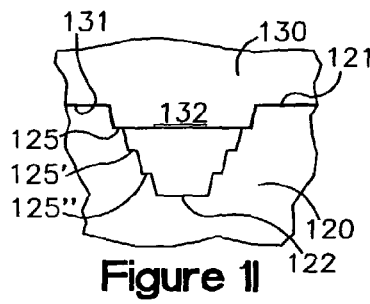
Figure 1J:
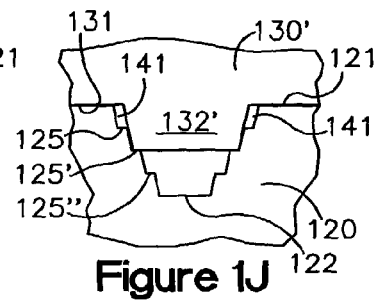
Figure 1K:
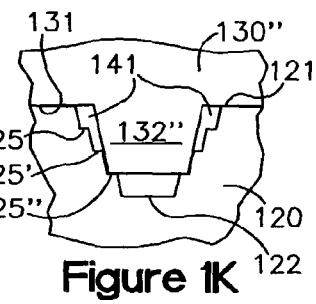

The depression/projection construction of the microchamber 140 allows the same base layer 120 to be used with different lid layers 130, 130', 130'' (FIGS. 1C-1E) or different base layers 120, 120', 120'' to be used with the same lid layer 130 (FIGS. 1F-1G) to construct microchambers 140, 140', 140'' of different dimensions or single chambers with changing dimensions along their length, as determined by the corresponding lid projection. By allowing one layer to remain constant or standard, material, equipment, and/or inventory requirements can be reduced while still constructing structures with different chamber specifications. With particular reference to depressions 122 including shelves between upper and lower sidewall regions, a series of shelves 125, 125', 125'' can be provided to accommodate different lid layers 130, 130', 130'' (FIGS. 1I-1K).

Figure 1L:
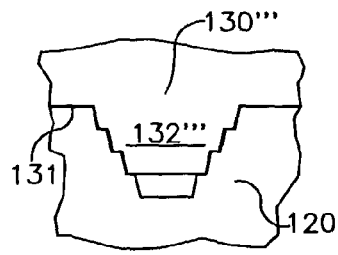

When one of the lower shelves 125' or 125'' serves as the stop for the lid layer 130' or 130'', the space 141 between the upper shelf 125 or 125/125' can be left open to form, for example, additional microchambers that could be used as overflow passages or a resistive break. (FIGS. 1J and 1K). In this manner, multiple layers of microchannels can be formed with a single base layer and a single cover layer. Alternatively, the lid layer 130''' can be constructed so that there is no space or void between the upper shelves and the lid layer 130'' (FIG. 1L).

Figure 1M:
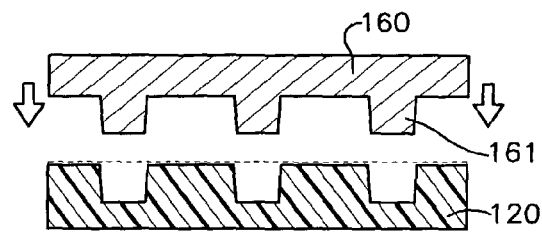
FIGS. 1M-1O are schematic views of a method of making the microchamber structure 140.
Figure 1N:
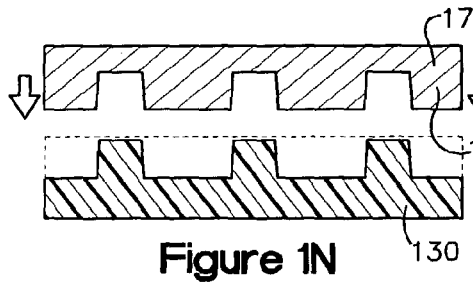
Figure 1O:
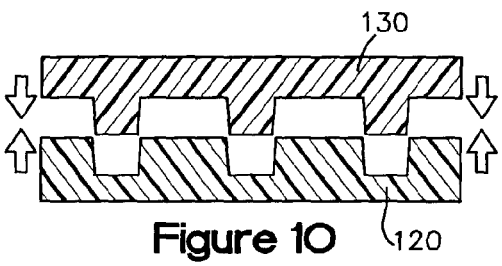

To make the microstructure 100, the base layer 120 can be embossed with a tool 160 having embossing elements 161 corresponding to the depression 122 (FIG. 1M) and the lid layer 130 can be embossed with a tool 170 having embossing elements 171 corresponding to the negative of the projections 132 in the lid layer 130 (FIG. 1N). The embossed layers 120 and 130 are aligned so that the depressions 122 are positioned to mate with the projections 132. (FIG. 1O). The aligned layers are moved towards each other to form the microchamber structure 140. (FIG. 1F.) If necessary or desired, adhesive, ultrasonic welding, thermal bonding, and/or other suitable procedures can be used to bond the interface between the surfaces 121 and 131.

In one embodiment, the lid layer is bonded to the base layer by applying a solvent or solvents to one or both of the lid layer interface 121 and base layer interface 131. Solvent bonding methods are well known in the art and are described in, e.g., Plastics Technology, Robert V. Milby (McGraw-Hill 1973), and Handbook of Plastics Joining: A Practical Guide (Plastics Design Library, 1996), both of which are incorporated herein by reference. The solvent acts to soften the thermoplastic film(s) and facilitates inter-diffusion of polymer chains from the film(s). The solvent used to bond the lid layer to the base layer depends on the composition of the particular thermoplastic film(s) and the bonding temperature. Examples of useful solvents include aromatic, aliphatic, cycloaliphatic and polar organic solvents.

In another embodiment, a polymer/solvent solution is used to bond the lid layer to the base layer. The polymer/solvent solution is applied to one or both of the lid layer interface 121 and base layer interface 131. The polymer/solvent solution used to bond the lid layer to the base layer depends on the composition of the particular thermoplastic film(s) and the bonding temperature. Illustrative polymers include polymethylmethacrylate (PMMA), polycarbonate, polytetrafluoroethylene (TEFLON™), polyvinylchloride (PVC), polydimethylsiloxane (PDMS), polysulfone, polystyrene, polymethylpentene, polypropylene, polyethylene, polyvinylidine fluoride, ABS (acrylonitrile-butadiene-styrene copolymer), and the like. Illustrative solvents include aromatic, aliphatic, cycloaliphatic and polar organic solvents.

Details of one possible method of embossing a thermoplastic base layer and/or a thermoplastic lid layer are set forth in U.S. Provisional Patent Application No. 60/349,596 filed on Jan. 18, 2002. Although this other application relates primarily to the making of through-holes or vias, the concepts outlined therein can be used to emboss the base cover 120 and/or the lid layer 130, and its entire disclosure is hereby incorporated by reference. That being said, other methods of forming the depressions 122 in the base layer 120 and/or the projections 132 in the lid layer 132 are possible with and contemplated by the present invention.

In the microchamber structure 100, the mating of the projections 132 in the lid layer 130 with the depressions 122 in the base layer 120 assures proper inter-layer alignment and/or provides a joining that is stable and consistent at small sizes. Specifically, the tapering design of the depressions/projections helps to guide the layers 120 and 130 into alignment and then essentially "lock" this interlayer alignment. Also, with particular reference to the interference-fit embodiment, it can serve to more securely isolate the microchambers 140.

Figure 2:
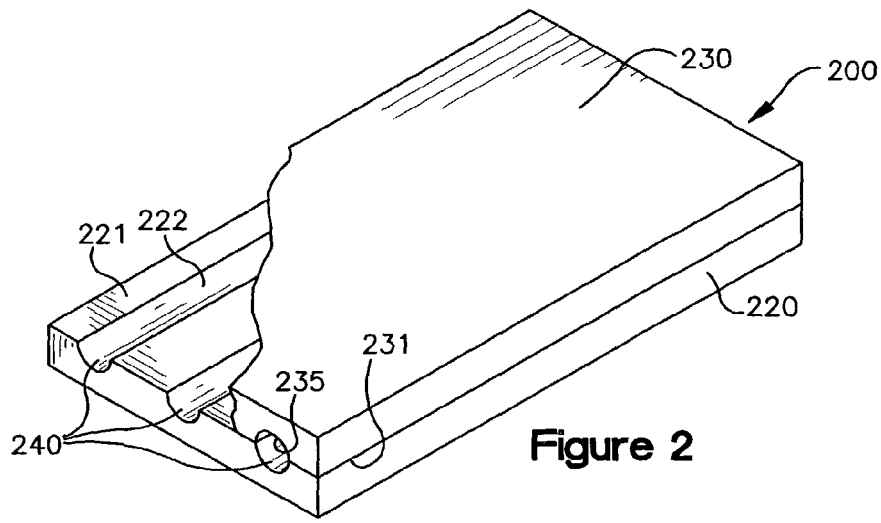
FIG. 2 is a perspective, partially cut-away, view of a microchamber structure 200 according to the present invention, the structure including at least one microchamber 240.
Figure 2A:
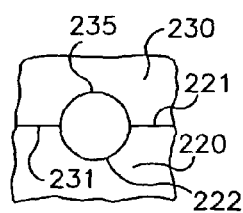
FIGS. 2A-2G are close-up cross-sectional views of the microchamber 240 according to different embodiments of the invention.
Figure 2B:
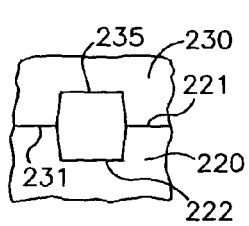
Figure 2C:
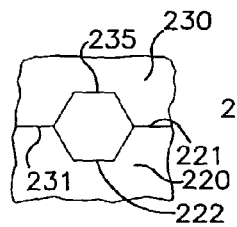
Figure 2D:
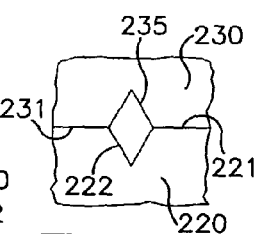
Figure 2E:
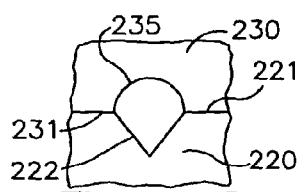

Referring now to FIG. 2, another microchamber structure 200 according to the present invention is shown. The structure 200 includes a base layer 220, a lid layer 230, and at least one covered microchamber 240. The superimposed layers 220 and 230 have surfaces 221 and 231, respectively, positioned adjacent to each other. The microchamber 240 has a cross-sectional shape with a depth (d) of less than 1000 microns and a width (w) of less than 1000 microns, a depth (d) of less than 500 microns and a width (w) of less than 500 microns, and/or a depth (d) of less than 250 microns and a width (w) of less than 250 microns, whereby it can be incorporated into devices requiring covered microchambers.

Figure 2F:
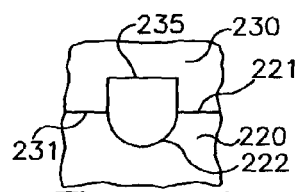
Figure 2G:
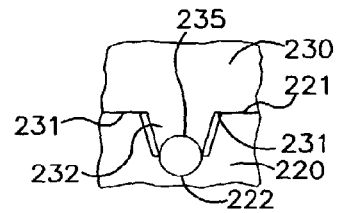

As is best seen in FIGS. 2A-2G, the base layer 220 includes a depression 222 extending inwardly from its lid-adjacent surface 221, and the lid layer 230 includes a depression 235 aligned with the depression 222. The shape and size of the depressions 222 and 235 define the cross-sectional shape of the microchamber 240. To this end, the depressions 222 and 235 can be symmetrically shaped (FIGS. 2A-2C and 2G) to form circular (FIGS. 2A and 2G) or polygonal (FIGS. 2B and 2C) microchambers 240. The depressions 222 and 235 can instead have non-symmetrical and/or different geometries to form, for example, a diamond shape (FIG. 2D), an ice-cream cone shape (FIG. 2E), and/or a bullet-like shape (FIG. 2F). Additionally or alternatively, the lid layer 230 can include a projection 232 (e.g., as shown in any of FIGS. 1A-1K) on which the depression 235 is formed (FIG. 2G).

Figure 2H:
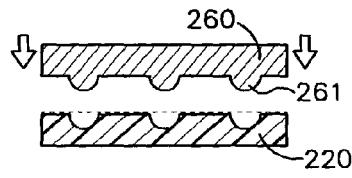
FIGS. 2H-2J are schematic views of a method of making the microchamber structure 200.
Figure 2I:
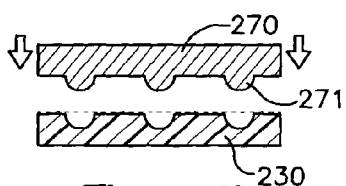
Figure 2J:
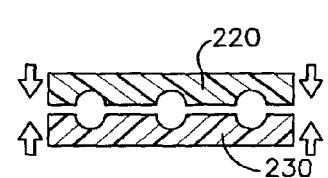

The microchamber structure 200 can be made in much the same manner as the microchamber structure 100. Specifically, for example, the base layer 220 can be embossed with a tool 260 having embossing elements 261 corresponding to the depressions 222 (FIG. 2H), and the lid layer 230 can be embossed with a tool 270 having embossing elements 271 corresponding to the depressions 235 (FIG. 2I). The embossed layers 220 and 230 are then aligned and moved towards each other to form the microchamber structure 200 (FIG. 2J).

The dual-depression design of the structure 200 allows the microchambers 240 to have shapes not possible (or at least extremely difficult) when, for instance, a flat lid layer is used.

Figure 3:
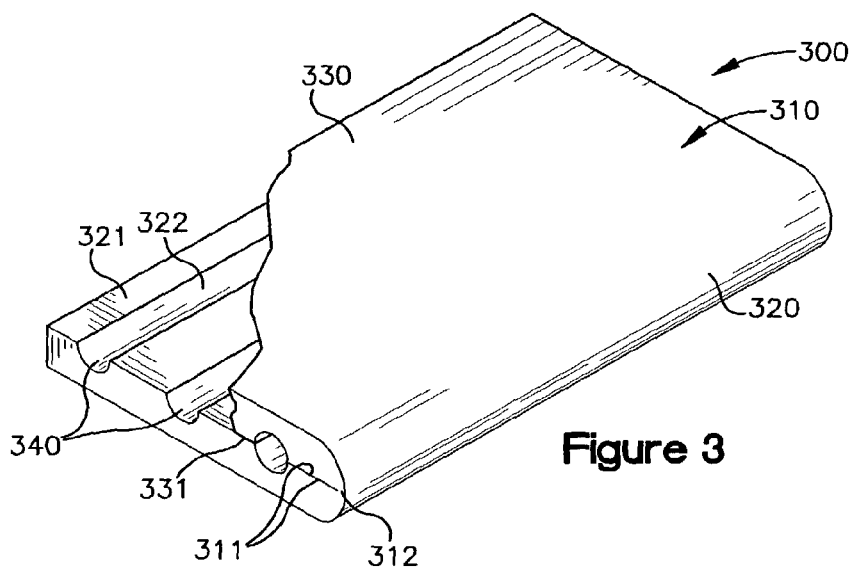
FIG. 3 is a perspective, partially cut-away, view of a microchamber structure 300 according to the present invention, the structure including at least one microchamber 340.

Referring now to FIG. 3, another microchamber structure 300 according to the present invention is shown. The structure 300 includes a sheet 310 with a coextensive surface 311 (the top surface in the illustrated orientation) and a foldline 312. The foldline 312 separates the sheet into a base layer 320 and a lid layer 330 and, in doing so, separates the surface 311 into a surface 321 of the base layer 320 and a surface 331 of the lid layer 330. In the finished structure 300, the sheet 310 is folded about its foldline 311 so that the layers 320 and 330 are superimposed, with the surfaces 321 and 331 positioned adjacent to each other. The structure 300 includes at least one microchamber 340 between the layers 320 and 330, each microchamber 340 having a cross-sectional shape with a depth (d) of less than 1000 microns and a width (w) of less than 1000 microns, a depth (d) of less than 500 microns and a width (w) of less than 500 microns, and/or a depth (d) of less than 250 microns and a width (w) of less than 250 microns.

Figure 3A:
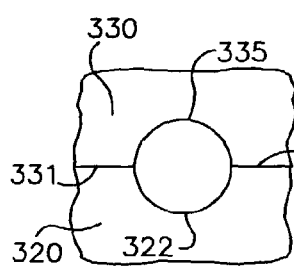
FIGS. 3A-3C are close-up cross-sectional views of the microchamber 340 according to different embodiments of the invention.
Figure 3B:
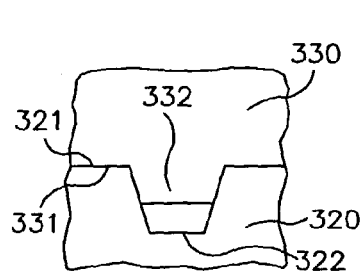
Figure 3C:
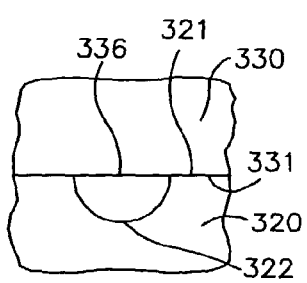

As shown in FIGS. 3A-3C, the base layer 320 can have a depression 322, and the lid layer 330 can have a mating depression 335 (FIG. 3A), a projection 332 (FIG. 3B), or can even be flat portion 336 (FIG. 3C). It should be appreciated that the depressions 322, the depressions 335, and/or the projections 332 can take on any of the shapes and/or sizes previously discussed in connection with components 122, 222, 132, 232, and 235, as well as many other possible geometries that could be accommodated. In any event, the depression 322 in the base layer 320 and the aligned portion 335/332/336 of the lid layer 330 define the shape of the microchamber 340.

Figure 3D:
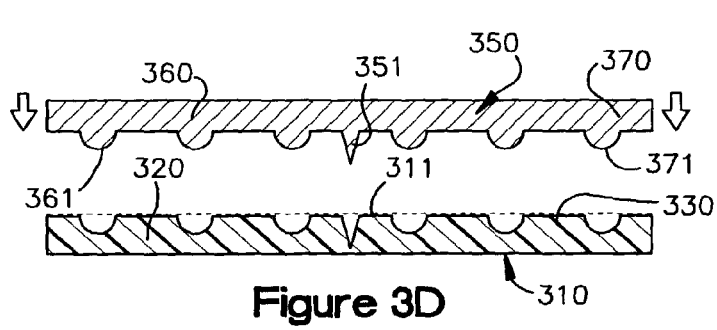

The microchamber structure 300 can be made in the same manner as the structures 100 and 200 except that, significantly, only the single sheet 310 needs to be embossed, thereby essentially cutting the embossing steps in half and permitting simultaneous fabrication of base and lid layers. Specifically, a tool 350 can be provided, having a base section 360 with embossing elements 361 corresponding to the depressions 322 in the base layer 320, and a lid section 370 with embossing elements 371 corresponding to the lid portions. The tool 350 could also include a fold-forming element 351 to form the foldline 312 in the sheet 310. (FIGS. 3D, 3G and 3J.)

Figure 3E:
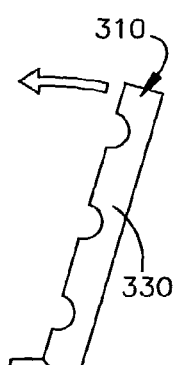
Figure 3F:
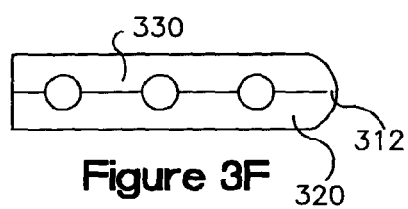

If the lid portions of the lid layer 330 are depressions (e.g., FIG. 3A), then the embossing elements 371 could be projections corresponding to these depressions. (FIG. 3D.) After the co-extensive surface 311 of the sheet 310 is embossed, it could be folded along its foldline 312 by pivoting the base layer 320 towards the lid layer 330 and/or pivoting the lid layer 330 towards the base layer 320. (FIG. 3E.) Once the surfaces 321 and 331 are superimposed, and the microchambers 340 are formed (FIG. 3F), adhesive, welding and/or other means can be used to secure the sheet 310 in its folded condition.

If the lid portions of the layer 330 are projections (e.g., FIG. 3B), then lid section 370 of the tool 350 could have embossing elements 371 corresponding to the negative of these projections 332. (FIG. 3G.) The embossed sheet 310 could then be folded along its foldline 312 (FIG. 3H) until the surfaces 321 and 331 are superimposed (FIG. 3I). If the lid portions of the lid layer 330 are flat regions, the lid layer 330 does not need to be embossed, whereby this section 370 of the tool 350 can be a blank and/or non-existent (FIG. 3J) and the same folding steps can be applied to create the structure 300 (FIGS. 3K and 3L).

Because the base layer 320 and the lid layer 330 are simultaneously embossed with the same tool 350, process variations alignment issues are minimized with the microchamber structure 300 as compared to, for example, two separate tools being used to create the two layers 320 and 330. (See e.g., FIGS. 1M-1P and/or FIGS. 2H-2J.)

Figure 4:
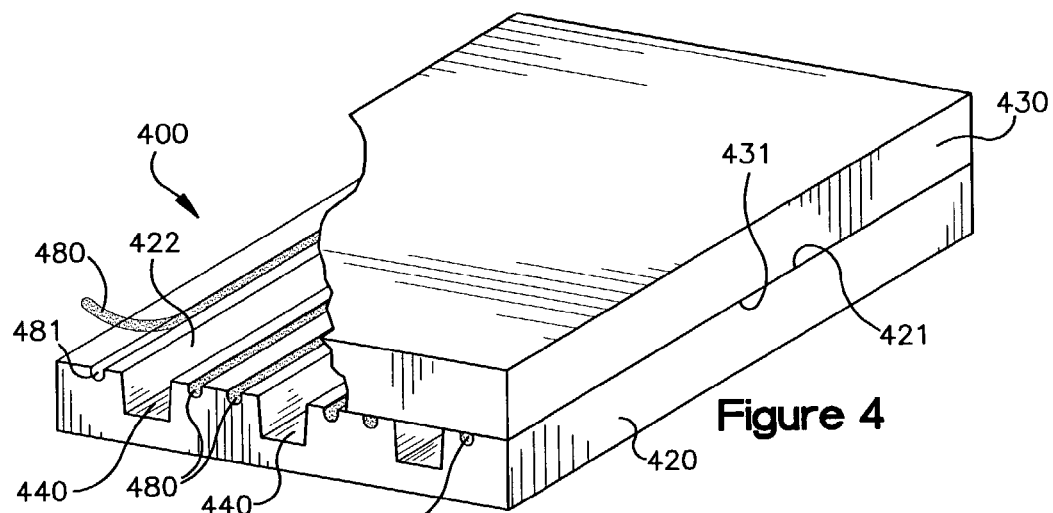
FIG. 4 is a perspective, partially cut-away, view of a microchamber structure 400 according to the present invention, the structure including at least one microchamber 440.

Referring now to FIG. 4, another microchamber structure 400 according to the present invention is shown. The structure 400 includes a base layer 420, a lid layer 430, and at least one covered microchamber 440. The microchamber 440 has a cross-sectional shape with a depth (d) of less than 1000 microns and a width (w) of less than 1000 microns, a depth (d) of less than 500 microns and a width (w) of less than 500 microns, and/or a depth (d) of less than 250 microns and a width (w) of less than 250 microns, whereby it can be incorporated into microdevices requiring covered chambers. The superimposed layers 420 and 430 have surfaces 421 and 431, respectively, positioned adjacent to each other, and attached together by an adhesive 480. The adhesive 480 can comprise any suitable compound compatible with the structure's material make-up and intended use.

Figure 4A:
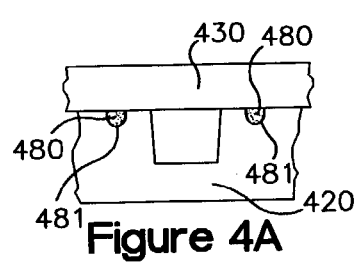
FIGS. 4A-4K are close-up cross-sectional views of the microchamber 440 according to different embodiments of the invention.
Figure 4B:
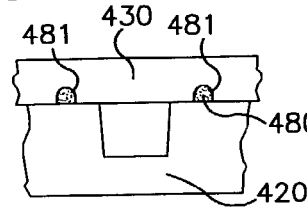
Figure 4C:
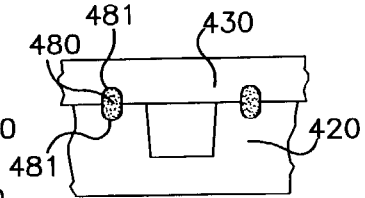
Figure 4D:
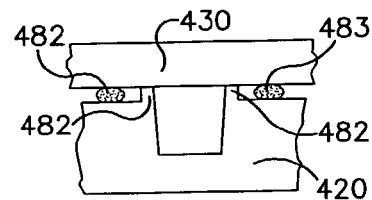
Figure 4E:
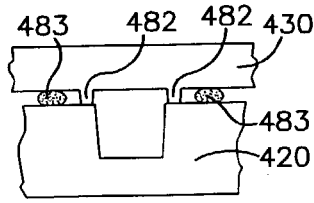
Figure 4F:
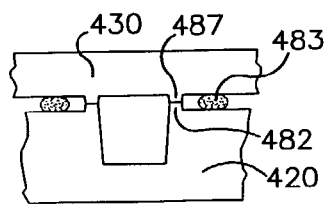
Figure 4G:
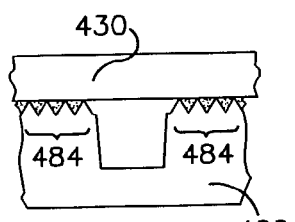
Figure 4H:
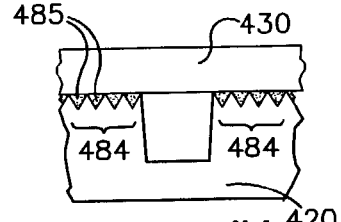
Figure 4I:
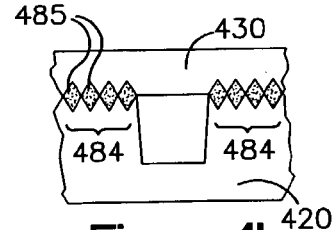

The base layer 420 includes a depression 422, at least partially defining the microchamber 440 and grooves 481 on either side thereof. (FIG. 4A.) The lid layer 430 could instead include the groove(s) 481 (FIG. 4B), or both layers 420 and 430 could include such groove(s) 481 (FIG. 4C). In any case, the walls defining the groove(s) 481 form a groove-shaped recess 485 for the adhesive 480. Instead of grooves, the base layer 420 and/or the lid layer 430 could include a ledge 482 on either side of the microchamber 440 to separate it from a recess 485 containing the adhesive 480 (FIGS. 4E-4F). Additionally or alternatively, the base layer 420 and/or the lid layer 430 could include a series of protrusions (or recesses) 484, forming a series of passage-shaped recesses 485 containing the adhesive 480. It may be noted that in many cases, the recess 485 does really serve as a container for the adhesive 480, but rather as a barrier to prevent the adhesive from slipping into the microchamber 440.

Figure 4J:
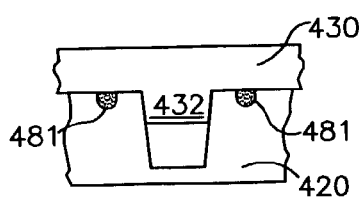
Figure 4K:
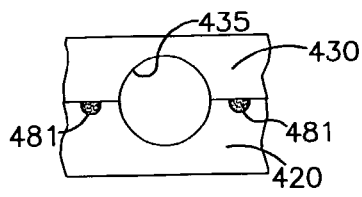

While the microchambers 440 shown in FIGS. 4A-4I are covered with a lid portion 436 which is essentially flat; the non-flat lid portions shown in FIGS. 1A-1L, 2A-2G, and 3A-3B and/or the folded construction shown in FIGS. 3A-3C could also incorporate the adhesive-containing recesses 485. (See e.g., FIGS. 4J and 4K.)

Figure 4M:
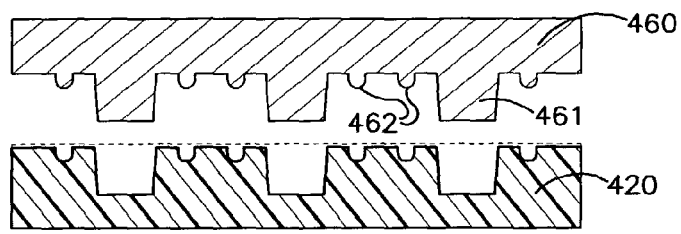
FIGS. 4M-4U are schematic views of a method of making the microchamber structure 400.
Figure 4N:
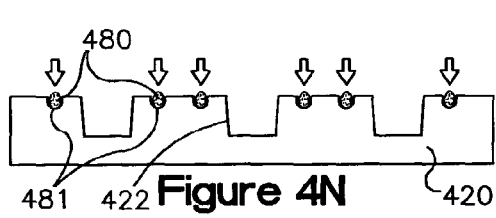
Figure 4O:
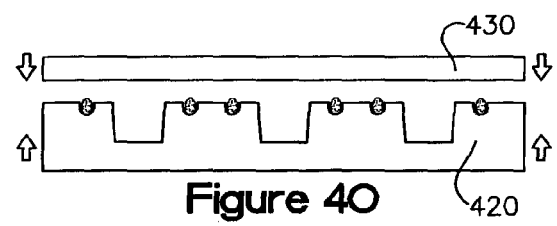
Figure 4P:
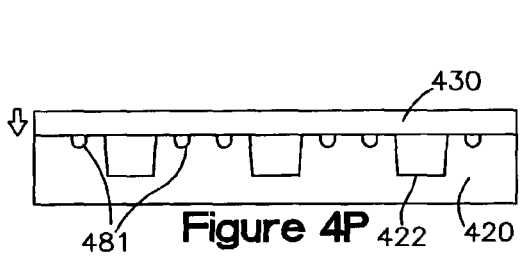
Figure 4Q:
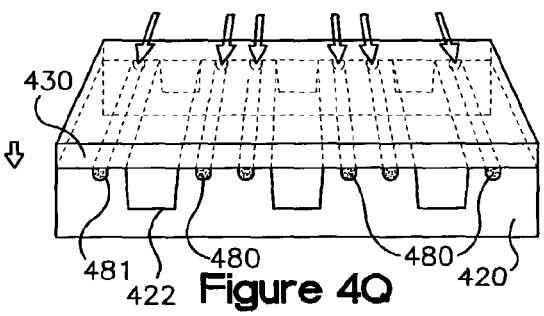
Figure 4R:
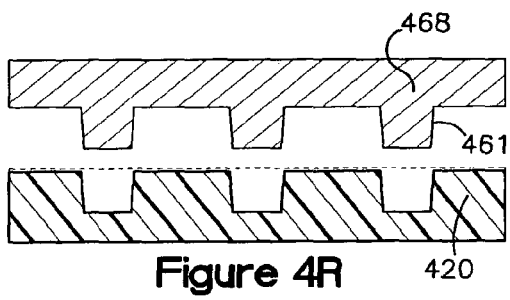
Figure 4S:
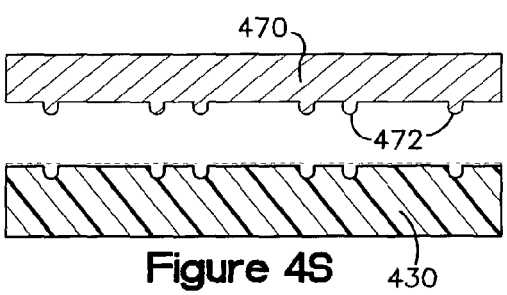
Figure 4T:
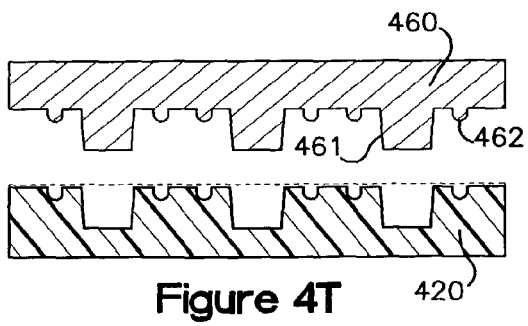
Figure 4U:
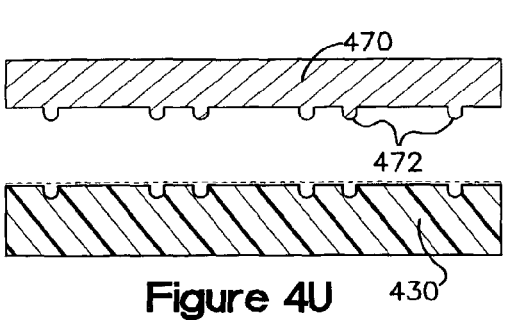

The microchamber structure 400 can be made in much the same manner as the microchamber structures 100, 200 and/or 300. Specifically, for example, with the microchamber embodiment shown in FIG. 4A, the base layer 420 can be embossed with a tool 460 having embossing elements 461 corresponding to the depressions 422, and embossing elements 462 corresponding to the grooves 481. (FIG. 4M.) The adhesive 480 can then be placed in the grooves 481 by a suitable process, such as, for example, printing. (FIG. 4N.) Thereafter, the layers 420 and 430 can be brought together. (FIG. 4O.) Alternatively, the layers 420 and 430 can first be brought together and then the adhesive 480 can be injected into the grooves 481. (FIGS. 4P and 4Q.) The microchamber embodiments shown in FIGS. 4B and 4C would be made in a similar manner, with a tool 470 being provided with embossing elements 472 corresponding to the grooves 481. (FIGS. 4R-4U.) Analogous method steps could be used to make the other illustrated microchamber embodiments (FIGS. 4D-4I), with the tools 460/470 including embossing elements 462/472 to form the ledges 482 and/or the protrusions 484.

The microchamber structure 400 provides for placement of the layer-to-layer attachment adhesive 480 in confined spaces. This minimizes the chance of the lid layer 430 being tilted or slanted due to "hills" of adhesive being formed between surfaces 421 and 431 as could occur, for example, when adhesive is placed between flat planar regions of these surfaces. Additionally or alternatively, this placement reduces the risk of dripping or spilling of adhesive into the microchambers 440. Where the properties of the surfaces of a microchamber are important to its function, the methods described above allow for a uniform surface material to form the walls of the microchamber structure.

Referring now to FIG. 5, another microchamber structure 500 according to the present invention is shown. The structure 500 includes a base layer 520, a lid layer 530, and at least one covered microchamber 540. The microchamber 540 has a cross-sectional shape with a depth (d) of less than 1000 microns and a width (w) of less than 1000 microns, a depth (d) of less than 500 microns and a width (w) of less than 500 microns, and/or a depth (d) of less than 250 microns and a width (w) of less than 250 microns, whereby it can be incorporated into devices requiring covered microchambers. The superimposed layers 520 and 530 have surfaces 521 and 531, respectively, positioned adjacent to each other.

Figure 5A:
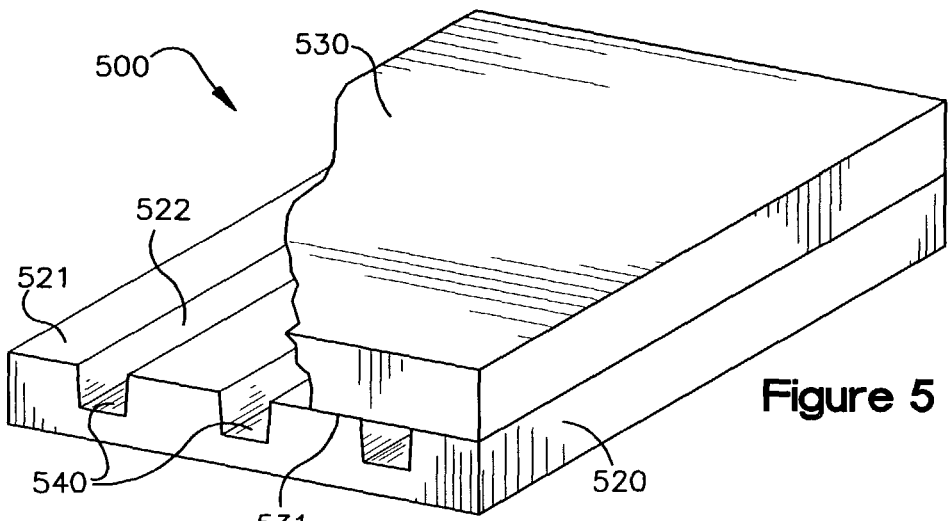
FIG. 5A is a close-up cross-sectional view of the microchamber 540.
Figure 5A:
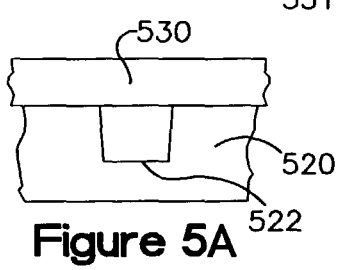
Figure 5B:
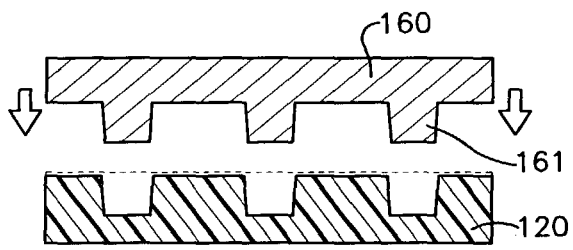
FIGS. 5B-5D are schematic views of a method of making the microchamber structure 500.
Figure 5C:
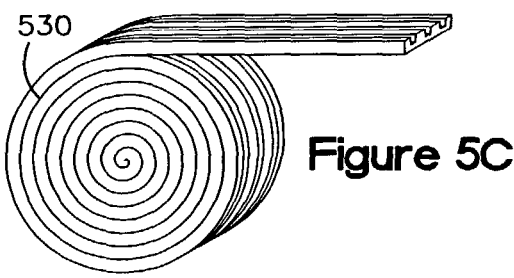

As is best seen in FIG. 5A, the base layer 520 includes a depression 522 at least partially defining the microchamber 540, and the lid layer 530 is made of compliant material, such as foam. As shown in FIGS. 5B-5D, the structure 500 can be made in much the same manner as the base layers 120, 220, 320 and 420; that is with a tool 560 having embossing elements 561 corresponding to the depressions 522. (FIG. 5B.) It may be convenient to compile the embossed material into a roll 563 (FIG. 5C) so that the lid layer 530 (also compiled in a roll 573) can be easily superimposed thereon with a machine 553 including, for example, supply reels 554 and 555 and downstream press rollers 556. (FIG. 5D.) Since the foam lid layer 530 is not embossed in the illustrated embodiment, interlayer alignment is not as critical as it would be when, for example, the lid layer includes embossed projections or depressions. (See e.g., FIGS. 1-4.)

Figure 5E:
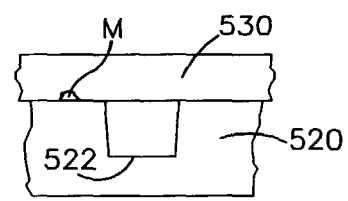
FIG. 5E is a close-up cross-sectional view of the microchamber 540 with a particle M lodged between chamber-defining layers.
Figure 5D:
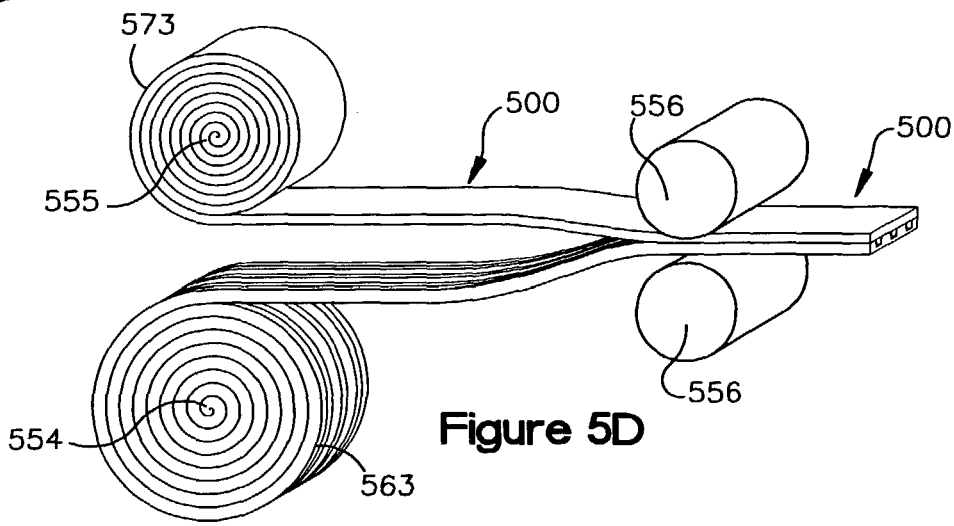

The advantage of the foam-lid construction of the structure 500 is best seen by referring to FIG. 5E. Specifically, if a miniature particle M (e.g., roughly in the range of five microns) inadvertently gets trapped between the surfaces 521 and 531, the foam lid layer 530 is able to conform to accommodate this indiscretion without sacrificing the desired parallel interface between the base and lid layers. In comparison, with rigid lid layers, even a very small particle can upset this layer-to-layer interface, causing the lid layer (for example) to skew from its locally required planar orientation.

Figure 6:
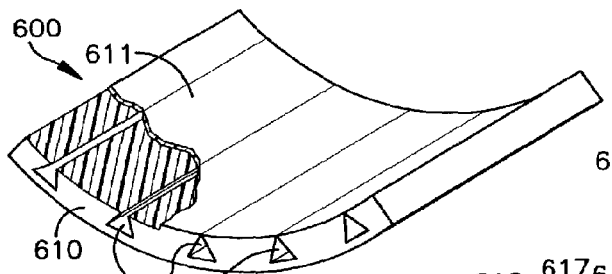
FIG. 6 is a perspective, partially cut-away, view of a microchamber structure 600 according to the present invention, the structure including at least one microchamber 640.

Referring now to FIG. 6, another microchamber structure 600 according to the present invention is shown. The microchamber structure 600 includes a sheet 610 having at least one microchamber 640 formed therein. The microchamber 640 has a cross-sectional shape with a depth (d) of less than 1000 microns and a width (w) of less than 1000 microns, a depth (d) of less than 500 microns and a width (w) of less than 500 microns, and/or a depth (d) of less than 250 microns and a width (w) of less than 250 microns, whereby it can be incorporated into devices requiring covered microchambers.

Figure 6A:
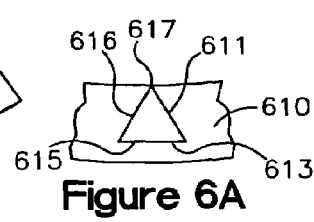
FIGS. 6A-6C are close-up cross-sectional views of the microchamber 640 according to different embodiments of the invention.
Figure 6B:
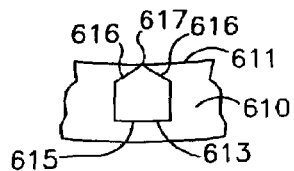
Figure 6C:
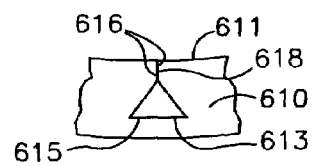

As is best seen in FIGS. 6A-6C, the sheet 610 includes a coextensive surface 611 and at least one depression 613 extending inwardly from the surface 611. The depression 613 is defined by opposed sidewalls 614 and a bottom wall 615 therebetween and can form, for example, a triangular shape (FIGS. 6A and 6C), a house-like shape (FIG. 6B), and/or other polygonal, circular, or irregular shapes. The sidewalls 614 each include lid regions 616, which are remote from the bottom wall 615 and adjacent the surface 611. The lid regions 616 contact each other to form a lid for the microchamber 640, and can be of short duration to form a corner joint 617 at the surface 611 (FIGS. 6A and 6B) or can be of relatively longer duration to form a seam 618 extending from the surface 611 to the microchamber 640 (FIG. 6C).

Figure 6D:
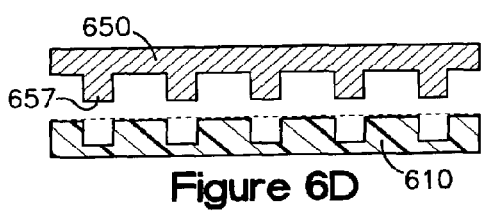
FIGS. 6D-6O are schematic views of a method of making the microchamber structure 600.
Figure 6E:
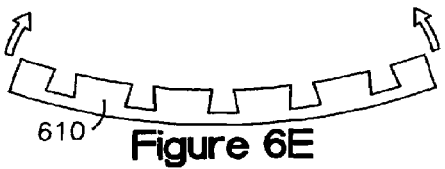
Figure 6F:
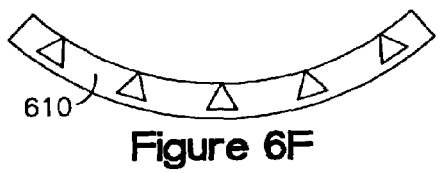
Figure 6G:
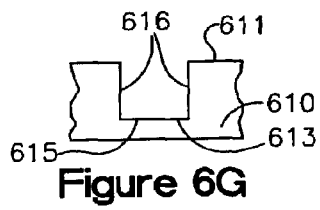
Figure 6H:
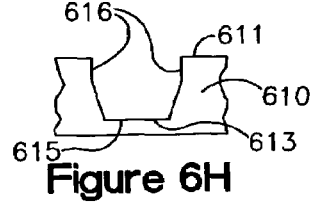
Figure 6I:
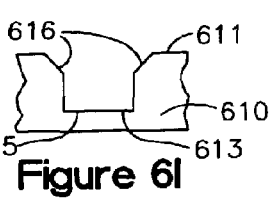
Figure 6J:
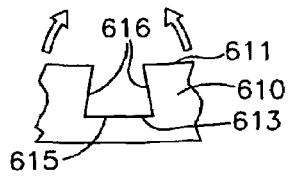
Figure 6K:
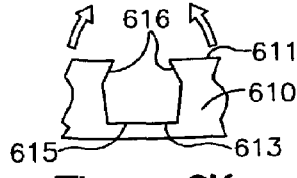
Figure 6L:
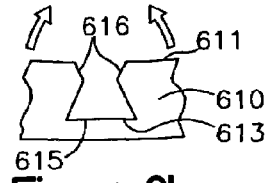
Figure 6M:
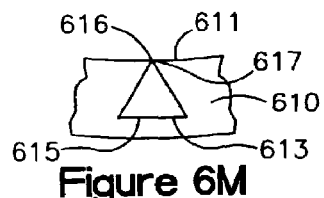
Figure 6N:
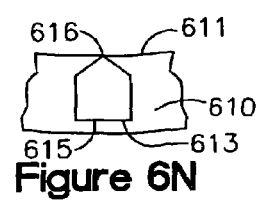
Figure 6O:
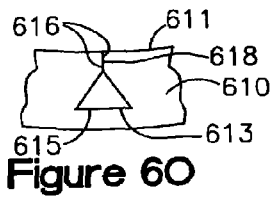

The microchamber structure 600 can be made by embossing the sheet 610 with a tool 650 having embossing elements 657 corresponding to the depressions 613. (FIG. 6D.) If the depression 613 is to have a triangular cross-sectional shape with a corner joint 617 (FIG. 6A), the embossing element 657 will have a rectangular profile so that the depression 613 will initially have a rectangular shape. (FIG. 6G.) If the depression 613 is to have a house-like shape with a corner joint 617 (FIG. 6B), the embossing element 657 will have a profile to form a rectangular shape as well as crease lines in the sidewalls 614. (FIG. 6H.) If the depression 613 is to have a triangular shape with a seam 618 (FIG. 6C), the embossing element 657 can have a roughly funnel-like shape. (FIG. 6I.) This embossing step can be very much the same as the embossing steps used to form the base layers 120, 220, 320, 420 and 520, and the embossing elements 657 can certainly be modified to form other shapes. In any case, the embossed sheet 610 is then curled (FIGS. 6E and 6J-6K) until the lid regions 616 of the depression-defining walls contact each other (FIG. 6F and 6M-6O). The sheet 610 can then be secured in this curved shape by any suitable technique such as, for example, mounting either or both surfaces of the sheet 610 to curved frame member(s).

The microchamber structure 600 provides an advantage in that the closed microchambers 640 are formed from only one sheet and/or layer, whereby inter-layer alignment and attachment issues are eliminated. Additionally or alternatively, the structure 600 is especially suitable for situations requiring a curved array of microchambers 640.

Figure 7:
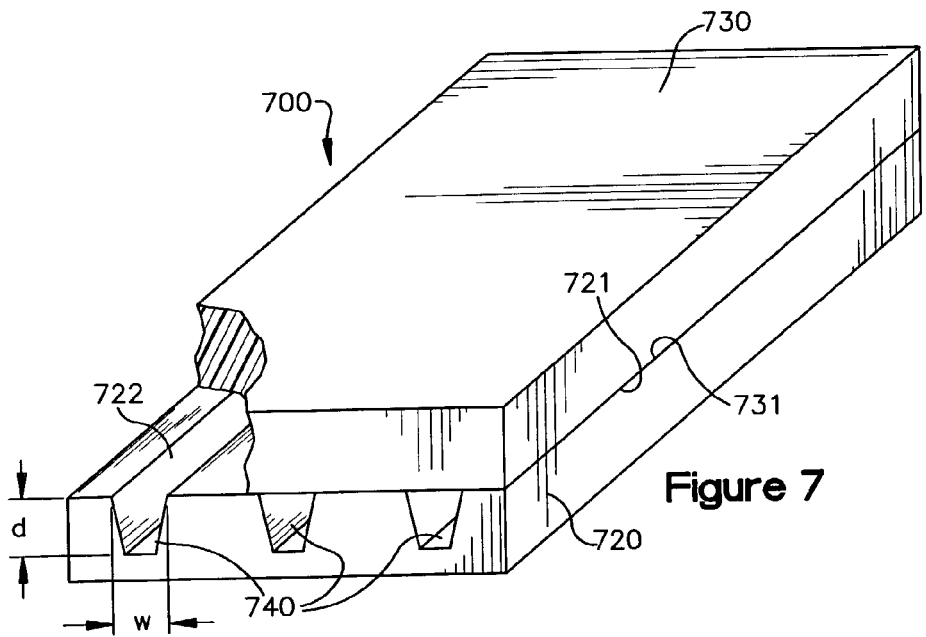
FIG. 7 is a perspective, partially cut-away, view of a microchamber structure 700 according to the present invention, the structure including at least one microchamber 740.

Referring now to FIG. 7, another microchamber structure 700 according to the present invention is shown. The microchamber structure 700 includes a sheet 710 having at least one microchamber 740 formed therein. The microchamber 740 has a cross-sectional shape with a depth (d) of less than 1000 microns and a width (w) of less than 1000 microns, a depth (d) of less than 500 microns and a width (w) of less than 500 microns, and/or a depth (d) of less than 250 microns and a width (w) of less than 250 microns, whereby it can be incorporated into devices requiring covered microchambers.

The cover layer 730 comprises a dry photoimageable polymer film laminated to the base layer 720, this film preferably being either UV curable or thermally curable. Suitable commercially-available films include Pyralux PC and Varcel dry film, both available from E.I. duPont de Nemours & Co. The use of the photoimageable film as the cover layer 730 allows it to advantageously function not only as a lid but also as an adhesive. Further, the photoimageable cover film can be laser etched or wet etched to form additional z-vias and/or z-vias can be embossed in the cover film, just as in the substrate. Further details of the cover layer 730 and manufacturing methods are set forth in U.S. patent application Ser. No. 09/596,240 filed on Jun. 16, 2000; U.S. patent application Ser. No. 09/781,756 filed on Feb. 12, 2001; and/or U.S. patent application Ser. No. 10/015,319 filed on Dec. 12, 2001. These applications are owned by the assignee of the present invention and their entire disclosures are hereby incorporated by reference.

Figure 8:
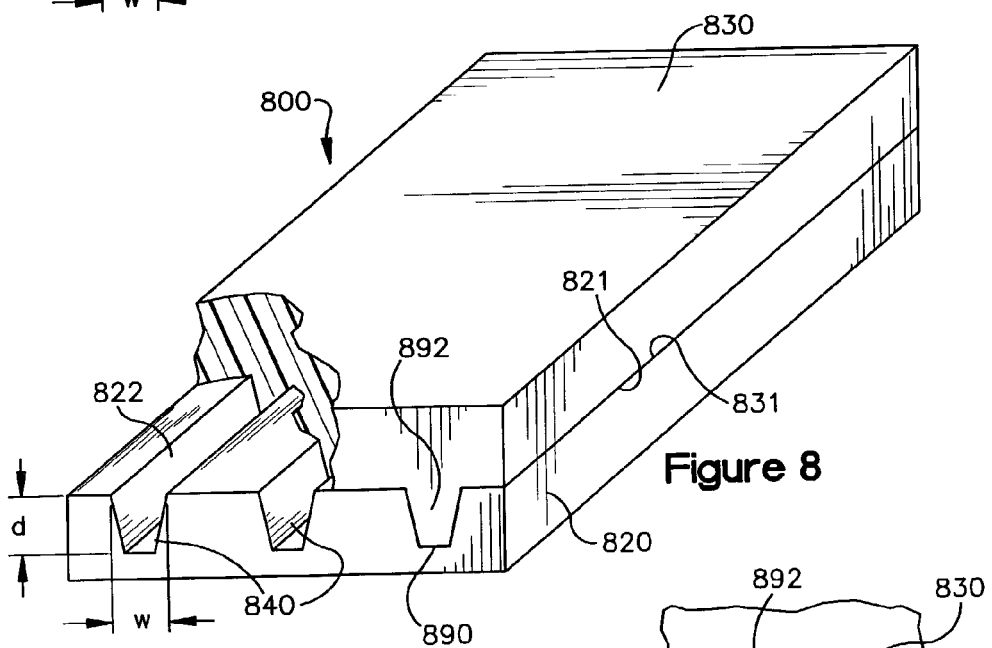
FIG. 8 is a perspective, partially cut-away, view of a microchamber structure 800 according to the present invention, the structure including at least one microchamber 840.

Referring now to FIG. 8, another microchamber structure 800 according to the present invention is shown. The microchamber structure 800 includes a sheet 810 having at least one microchamber 840 formed therein. The microchamber 840 has a cross-sectional shape with a depth (d) of less than 1000 microns and a width (w) of less than 1000 microns, a depth (d) of less than 500 microns and a width (w) of less than 500 microns, and/or a depth (d) of less than 250 microns and a width (w) of less than 250 microns, whereby it can be incorporated into devices requiring covered microchambers.

Figure 8A:
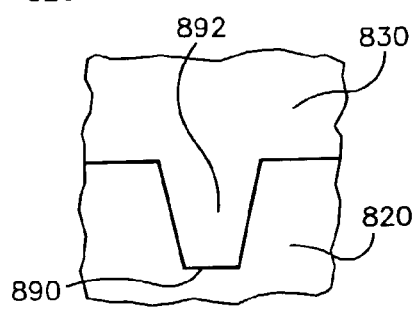
FIG. 8A is a close-up cross-sectional view of the registration components of the microchamber 840.

In the structure 800, the microchamber(s) 840 can be formed in a conventional manner (as shown) and/or in the same manner as microchambers 140, 240, 340, 440, 540, 640 and/or 740 discussed above. However, as is best seen in FIG. 8A, the structure 800 includes mating depressions 890 and projections 892 which serve solely for purposes of registration (i.e., they do not form microchambers). In the illustrated embodiment, the base layer 820 includes the depressions 890 and the cover layer 830 includes the projections 892, although this arrangement could be vice-versa. Also, other mating arrangements are possible with and contemplated by the present invention. The advantage of this approach is that the microchambers 840 can be formed at the same time as the registration components 890/892, thereby assuring alignment precision.

Figure 9A:
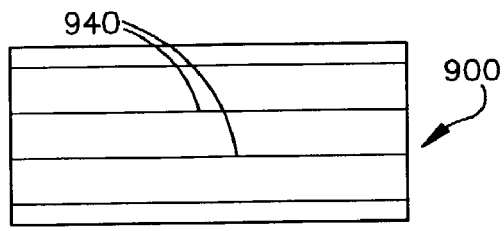
FIGS. 9A-9H are schematic plan views of a microchamber structure 900 having its microchambers 940 arranged according to different embodiments of the invention.
Figure 9B:
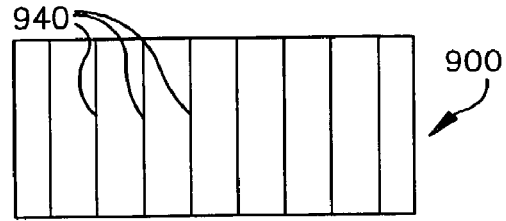
Figure 9C:
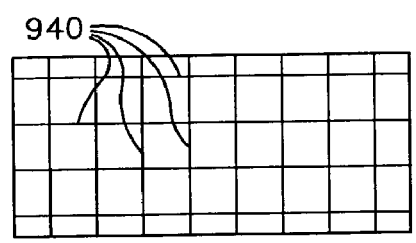
Figure 9D:
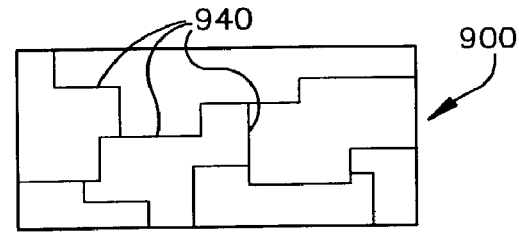
Figure 9E:
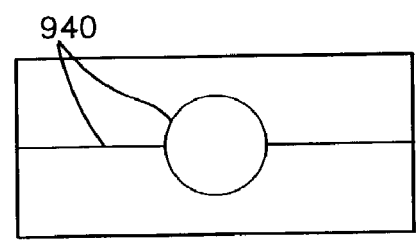
Figure 9F:
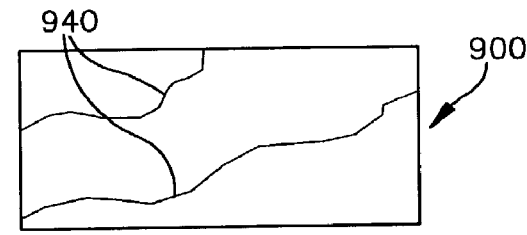
Figure 9G:
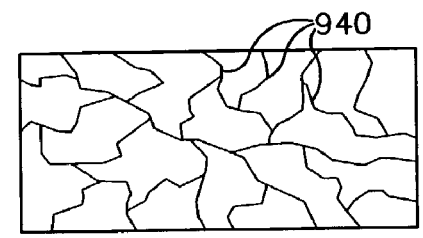
Figure 9H:
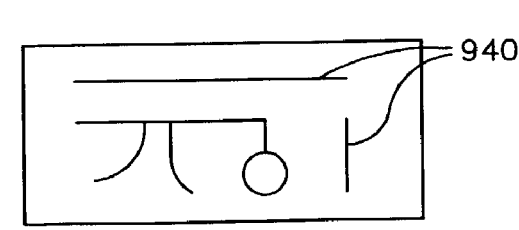

In the microchamber structures 100, 200, 300, 400, 500, 600, 700 and 800 discussed above, the microchambers were arranged in parallel rows extending the length of the sheet or layers, such as the microchambers 940 of the structure 900 shown in FIG. 9A. The microchambers 940 could instead be positioned in parallel columns extending the width of the sheet or layers (FIG. 9B), in a grid of rows and columns (FIG. 9C), in a map-like arrangement of straight roads (FIG. 9D), in a combination circular/straight pattern (FIG. 9E), and/or in irregular river-like shapes (FIGS. 9F and 9G). The microchambers 740 can travel in paths independently of each other (FIGS. 9A, 9B, and 9F) or can intersect one or more times with each other (FIGS. 9C, 9D, 9E and 9G). Also, although in FIGS. 9A-9G the microchambers 940 extend to the lateral and/or longitudinal edges of the sheet, as is shown in FIG. 9H, they can be in any of the above arrangements and terminate short of these edges. These and other chamber patterns are possible with and contemplated by the present invention and the microchambers 940 could incorporate some, all, or a combination of the features of any of the microchambers 140, 240, 340, 440, 540, 640, 740 and 840 discussed above.

Also, although in the microchamber structures 100, 200, 300, 400, 500, 600, 700, 800 and 900 discussed above the chambers 140, 240, 340, 440, 540, and 640 were shown void (or empty), they could instead take on the form of the microchambers 1040 shown in FIGS. 10A-10G and contain a coating 890, particles 891 and/or strands 892. For example, the entire perimeter of the microchamber 840 could be coated (FIG. 10A), a bottom portion could be coated (FIG. 10B), a top portion could be coated (FIG. 10C), or other select portions of the chamber's perimeter could be coated with the coating 890. Additionally or alternatively, the microchamber 840 could be completely or partially filled with the particles 891 (FIG. 10D) and/or could be filled with/by the strand 892 (FIG. 10E).

The coating 890, the particles 891, and/or the strand 892 can have properties compatible with the intended use of the microchamber structure 800; for example, light-reflecting properties, light-transmitting properties, filtering properties, electrically conductive properties, and/or thermally conductive properties. These and other enhancements to the microchamber interiors are possible with and contemplated by the present invention, and the microchambers 840 could incorporate some, all, or a combination of the features of any of the microchambers 140, 240, 340, 440, 540, 640, 740, 840 and 940 discussed above. With particular regard to the microchambers incorporating electrically conductive coatings, particles, or objects, further details are set forth in U.S. Provisional Patent Application No. 60/349,907 filed on Jan. 18, 2002, the entire disclosure of which is hereby incorporated by reference.

It may further be noted that a plurality of the microchamber structures 100, 200, 300, 400, 500, 600, 700, 800, and/or 900 could be stacked together to work in conjunction in a microfluidic, microelectronic, micromechanical, and/or microoptical device requiring multiple levels of covered microchambers. For example, a plurality of similar structures 1000 could be stacked together, with the base layer 1020 of the top level being positioned on top of the lid layer 1030 of the next level. (FIG. 11A.) Additionally or alternatively, adjacent structures 1000 could be separated by spacers 1001. (FIG. 11B.) Also, layers 1020 and/or layers 1030 could be embossed on both surfaces so that their top surfaces (in the illustrated embodiment) served as a base layer 1020 and their bottom surfaces served as a lid layer 1030. (FIG. 11G.) Further, depressions in the base layer 1020 and/or the lid layer 1030 could extend through the thickness of the layer (at least at certain points) to form a through-hole or via 1002. (FIG. 11D.) (Details of such through-holes or vias are set forth in U.S. Provisional Patent Application No. 60/349,296, the entire disclosure of which is hereby incorporated by reference.) These and other stacked arrangements of microchamber structures are possible with and contemplated by the present invention, and the structure could incorporate some, all, or a combination of the features of any of the structures 100, 200, 300, 400, 500, 600, 700, 800 and/or 900.

One may now appreciate that the present invention provides microchamber structures which can accommodate many microfluidic, microelectronic, micromechanical, and/or microoptical applications requiring covered chambers.

Although the invention has been shown and described with respect to certain preferred embodiments, it is obvious that equivalent and obvious alterations and modifications will occur to others skilled in the art upon the reading and understanding of this specification. The present invention includes all such alterations and modifications and is limited only by the scope of the following claims.

The invention claimed is:

1. A microchamber structure comprising a base layer, a lid layer, and at least one microchamber having a cross-sectional shape with a depth of less than 1000 microns and a width of less than 1000 microns; wherein:
   the base layer and the lid layer are superimposed, whereby one surface of the base layer is positioned adjacent to one surface of the lid layer;
   the base layer includes a depression extending inwardly from its lid-adjacent surface;
   the lid layer includes a projection protruding outwardly from its base-adjacent surface and positioned within the depression in the base layer; and
   the depression of the base layer and the projection of the lid layer define the cross-sectional shape of the microchamber;
   wherein the structure has lateral edges and the microchamber extends to the lateral edges.

2. A stack of a plurality of the microchamber structures as set forth in claim 1.

3. A stack of the microchamber structures as set forth in claim 2, wherein the structures have a similar construction.

4. A stack of the microchamber structures as set forth in claim 2, wherein the base layer of one level is positioned on top of the lid layer of the next level.

5. A stack of the microchamber structures as set forth in claim 2, wherein at least some of the adjacent structures are separated by spacers.

6. A microchamber structure as set forth in claim 1, comprising a plurality of said microchambers.

7. A microchamber structure as set forth in claim 6, wherein the plurality of microchambers are arranged in substantially parallel longitudinal rows.

8. A microchamber structure as set forth in claim 6, wherein the plurality of microchambers are arranged in substantially parallel transverse columns.

9. A microchamber structure as set forth in claim 6, wherein the plurality of microchambers are arranged in a grid of rows and columns.

10. A microchamber structure as set forth in claim 6, wherein the plurality of microchambers are arranged in a map-like arrangement of straight roads.

11. A microchamber structure as set forth in claim 6, wherein the plurality of microchambers are arranged in a combination circular/straight pattern.

12. A microchamber structure as set forth in claim 6, wherein the plurality of microchambers are arranged in irregular river-like shapes.

13. A microchamber structure as set forth in claim 6, wherein at least some of the plurality of microchambers travel in paths independently of each other.

14. A microchamber structure (800) as set forth in claim 6, wherein at least some of the plurality of microchambers (840) intersect one or more times with each other.

15. A microchamber structure as set forth claim 1, wherein at least a portion of the microchamber(s) contains a coating, particles and/or strands.

16. A microchamber structure as set forth in claim 15, wherein the coating, the particles, and/or the strand have filtering properties.

17. A microchamber structure as set forth in claim 15, wherein the coating, the particles, and/or the strand have electrically conductive properties.

18. A microchamber structure as set forth in claim 15, wherein the coating, the particles, and/or the strand have thermally conductive properties.

19. A microchamber structure as set forth in claim 1, in which the depth of the cross-sectional shape of the microchamber is less than 750 microns.

20. A microchamber structure as set forth in claim 1, in which the width of the cross-sectional shape of the microchamber is less than 750 microns.

21. A microchamber structure as set forth in claim 1, in which the depth of the cross-sectional shape of the microchamber is less than 500 microns.

22. A microchamber structure as set forth in claim 1, in which the width of the cross-sectional shape of the microchamber is less than 500 microns.

23. A microchamber structure as set forth in claim 1, in which the depth of the cross-sectional shape of the microchamber is less than 250 microns.

24. A microchamber structure as set forth in claim 1, in which the width of the cross-sectional shape of the microchamber is less than 250 microns.

25. A microchamber structure comprising a base layer, a lid layer, and at least one microchamber having a cross-sectional shape with a depth of less than 1000 microns and a width of less than 1000 microns; wherein:
- the base layer and the lid layer are superimposed, whereby one surface of the base layer is positioned adjacent to one surface of the lid layer;
- the base layer includes a depression extending inwardly from its lid-adjacent surface;
- the lid layer includes a depression extending inwardly from its base-adjacent surface and aligned with the depression in the base layer; and
- the shape and size of the aligned depressions define the cross-sectional shape of the microchamber;
- wherein the structure has lateral edges and the microchamber extends to the lateral edges.

26. A microchamber structure comprising a sheet and at least one microchamber having a cross-sectional shape with a depth of less than 1000 microns and a width of less than 1000 microns; wherein:
- the sheet has a coextensive surface and a foldline which separates the sheet into a base layer and a lid layer and which separates the coextensive surface into a surface on the base layer and a surface on the lid layer;
- the base layer and the lid layer are superimposed and the surface of the base layer is positioned adjacent to the surface of the lid layer;
- the base layer includes a depression extending inwardly from its lid-adjacent surface and the lid layer includes a lid portion aligned with the depression; and
- the depression of the base layer and the lid portion of the lid layer define the cross-sectional shape of the microchamber;
- wherein the structure has lateral edges and the microchambers extends to the lateral edges.

27. A microchamber structure comprising a base layer, a lid layer, at least one microchamber having a cross-sectional shape with a depth of less than 1000 microns and a width of less than 1000 microns, and an adhesive attaching the base layer and the lid layer together;
- the base layer and the lid layer are superimposed, whereby one surface of the base layer is positioned adjacent to one surface of the lid layer;
- the base layer includes a depression extending inwardly from its lid-adjacent surface, and the lid layer includes a lid portion aligned with the depression;
- the depression of the base layer and the lid portion of the lid layer define the cross-sectional shape of the microchamber;
- the base layer and/or the lid layer include walls forming a recess between their respective surfaces; and
- the adhesive is contained within the recess;
- wherein the structure has lateral edges and the microchamber extends to the lateral edges.

* * * * *